(12) United States Patent
Backus et al.

(10) Patent No.: US 10,514,411 B2
(45) Date of Patent: Dec. 24, 2019

(54) TESTING SYSTEM FOR MULTIPLE-UNIT LOCOMOTIVES

(71) Applicants: Bruce E. Backus, Atlanta, GA (US); Charles W. Yopp, Roanoke, VA (US)

(72) Inventors: Bruce E. Backus, Atlanta, GA (US); Charles W. Yopp, Roanoke, VA (US)

(73) Assignee: Norfolk Southern Corporation, Norfolk, VA (US)

( * ) Notice: Subject to any disclaimer, the term of this patent is extended or adjusted under 35 U.S.C. 154(b) by 20 days.

(21) Appl. No.: 15/827,770

(22) Filed: Nov. 30, 2017

(65) Prior Publication Data

US 2018/0149687 A1 May 31, 2018

Related U.S. Application Data

(60) Provisional application No. 62/428,473, filed on Nov. 30, 2016.

(51) Int. Cl.
*G01R 31/00* (2006.01)
*B61L 15/00* (2006.01)
*G01M 17/08* (2006.01)
*B60L 15/32* (2006.01)
*B61C 17/12* (2006.01)

(52) U.S. Cl.
CPC .......... *G01R 31/008* (2013.01); *B60L 15/32* (2013.01); *B61C 17/12* (2013.01); *B61L 15/0036* (2013.01); *B61L 15/0081* (2013.01); *G01M 17/08* (2013.01); *B60L 2200/26* (2013.01); *B60L 2250/16* (2013.01); *Y02T 90/16* (2013.01)

(58) Field of Classification Search
CPC ... G01R 31/008; B61C 17/12; B61L 15/0036; B61L 15/0081; B60L 15/32; B60L 2200/26; B60L 2250/16; G01M 17/08; Y02T 90/16
See application file for complete search history.

(56) References Cited

U.S. PATENT DOCUMENTS

| 6,021,366 A * | 2/2000 | Fieramosca | G01R 31/007 701/29.6 |
| 7,260,360 B2 * | 8/2007 | Seo | H04B 1/40 455/41.2 |
| 2004/0000898 A1 * | 1/2004 | Pool | G01R 31/023 324/66 |
| 2005/0275985 A1 * | 12/2005 | Gagnon | H02J 1/00 361/90 |

(Continued)

FOREIGN PATENT DOCUMENTS

EP    0039122 A2 * 11/1981    ............. G01R 31/07

*Primary Examiner* — Christopher P McAndrew
*Assistant Examiner* — Zannatul Ferdous
(74) *Attorney, Agent, or Firm* — Culhane Meadows PLLC

(57) ABSTRACT

Described herein is a system for testing one or more multiple-unit (MU) conductors on a locomotive using a first and second test unit together with a portable display unit having a wireless transceiver for communicating with the test units. The portable display may include a panel of LED indicators corresponding to the MU conductors to be tested and a user interface in the form of a display screen. The system may be used for running both test procedures and monitoring procedures. The wireless portable display unit allows a single technician to run the procedures and review information from both test units without using long and heavy MU jumper cables.

9 Claims, 5 Drawing Sheets

(56) References Cited

U.S. PATENT DOCUMENTS

| | | | |
|---|---|---|---|
| 2007/0046254 A1* | 3/2007 | Chen | H02J 7/0055 |
| | | | 320/107 |
| 2010/0019103 A1* | 1/2010 | Kane | B61C 17/12 |
| | | | 246/186 |
| 2014/0362574 A1* | 12/2014 | Barrett | F21S 2/00 |
| | | | 362/249.03 |
| 2015/0073629 A1* | 3/2015 | Kraeling | B61C 17/02 |
| | | | 701/19 |

* cited by examiner

TESTING SYSTEM FOR MULTIPLE-UNIT LOCOMOTIVES

CROSS-REFERENCE TO RELATED APPLICATIONS

The present application claims the benefit of and priority to U.S. Provisional Application 62/428,473 filed Nov. 30, 2016, entitled "Testing System for Multiple-Unit Locomotives," which is incorporated herein by reference in its entirety.

BACKGROUND

Certain disclosed embodiments relate to the field of multiple-unit (MU) train control systems and, more specifically, to a system for testing and monitoring the condition and status of MU components on locomotives.

Multiple-unit (MU) systems are designed to coordinate and manage the motive power provided by two or more locomotives engaged in moving a train. MU systems are generally more efficient, more reliable, and safer than using a single locomotive. In an MU system, each locomotive is connected to the others using a standard 27-pin MU jumper cable. Most modern locomotives include a 27-pin MU receptacle on each end. When the locomotives are connected, the MU system can be monitored and controlled from a single location by a single engineer.

The MU cable includes 27 conductors that are connected to the systems onboard the locomotive; each of the 27 conductors terminates at a particular pin. The 27 conductors and pins, and their functions, are standardized for MU train control systems used in North America. Other systems of MU conductors and pins are used in different regions of the world.

When equipment is changed or when new equipment is installed on a locomotive, there is usually a corresponding change to the onboard MU system. A complete test of the MU system and its components is typically required before the locomotive is permitted to return to active service.

Existing MU test systems require attaching a portable MU test unit to each end of the locomotive, and then checking each pin using a test light or meter. Coordinating the testing at both ends of the locomotive requires at least two technicians, in communication with one another, with each one operating one of the MU test units. If one technician wants to interface with both MU test units, a long and heavy MU cable can be run from each MU test unit to a central unit.

Moreover, current MU test systems require multiple field technicians and/or lengthy cabling between the remote MU test units in order to accomplish a straightforward test of the integrity of the MU components onboard a single locomotive.

Thus, there is need in the art for improved MU testing systems.

SUMMARY

A system for testing one or more MU conductors on a locomotive is described. According to various embodiments, for a locomotive having a front MU receptacle and a rear MU receptacle, the test system may include: (1) a first test unit connected to the front MU receptacle by a first jumper cable and comprising a first transceiver; (2) a second test unit connected to the rear MU receptacle by a second jumper cable and comprising a second transceiver; and (3) a portable display unit comprising a test switch, a screen, a wireless transceiver in communication with the first transceiver and the second transceiver, and a panel of indicators each corresponding to one of the one or more MU conductors on the locomotive, wherein the portable display unit is configured to execute a test procedure for evaluating the status of the one or more MU conductors and to display information about the status on both the screen and the panel of indicators.

The portable display unit may be further configured to execute a monitoring procedure for monitoring the condition of one or more onboard components, each of which is connected to one of the one or more MU conductors, and to display information about the condition on both the screen and the panel of indicators.

The one or more multiple-unit (MU) conductors may include twenty-seven MU conductors compliant with applicable standards for operation in North America. The panel of indicators may include a panel of twenty-seven LED lamps, each corresponding to one of the twenty-seven MU conductors and each configured to display at least two colors.

The portable display unit may further include a rechargeable battery connected to an external charging port that is sized and shaped to engage with a charging plug on a charging stand.

The first test unit may include a first MU cable receptacle sized and shaped to mate with and receive a connector on a proximal end of the first jumper cable. The second test unit may include a second MU cable receptacle sized and shaped to mate with and receive a connector on a proximal end of the second jumper cable.

The first test unit may include a first foot rest sized and shaped to support at least a portion of a foot to facilitate removal of the first jumper cable from the first MU receptacle. The second test unit may include a second foot rest sized and shaped to support at least a portion of a foot to facilitate removal of the second jumper cable from the second MU receptacle.

The first test unit may further include a power supply receptacle that is sized and shaped to mate with and receive a power cable from an external power supply, and the system may be configured to transmit power via the power supply receptacle to both the first test unit and the second test unit.

The transceivers in the system may be configured to operate using the ZigBee protocol.

Other apparatuses, methods, systems, features, and advantages of the disclosed embodiments will be apparent to one of ordinary skill in the art upon examination of the following figures and detailed description. All such additional apparatuses, methods, systems, features, and advantages are intended to be included within this description and to be included within the scope of the accompanying claims.

BRIEF DESCRIPTION OF THE DRAWING

Features of the various embodiments disclosed will become more apparent in the following detailed description, in which reference is made to the appended drawing figures, which are incorporated in and constitute a part of this specification, and wherein.

Corresponding reference numbers indicate corresponding parts or elements throughout the several views of the drawing.

DETAILED DESCRIPTION

Figure 1:
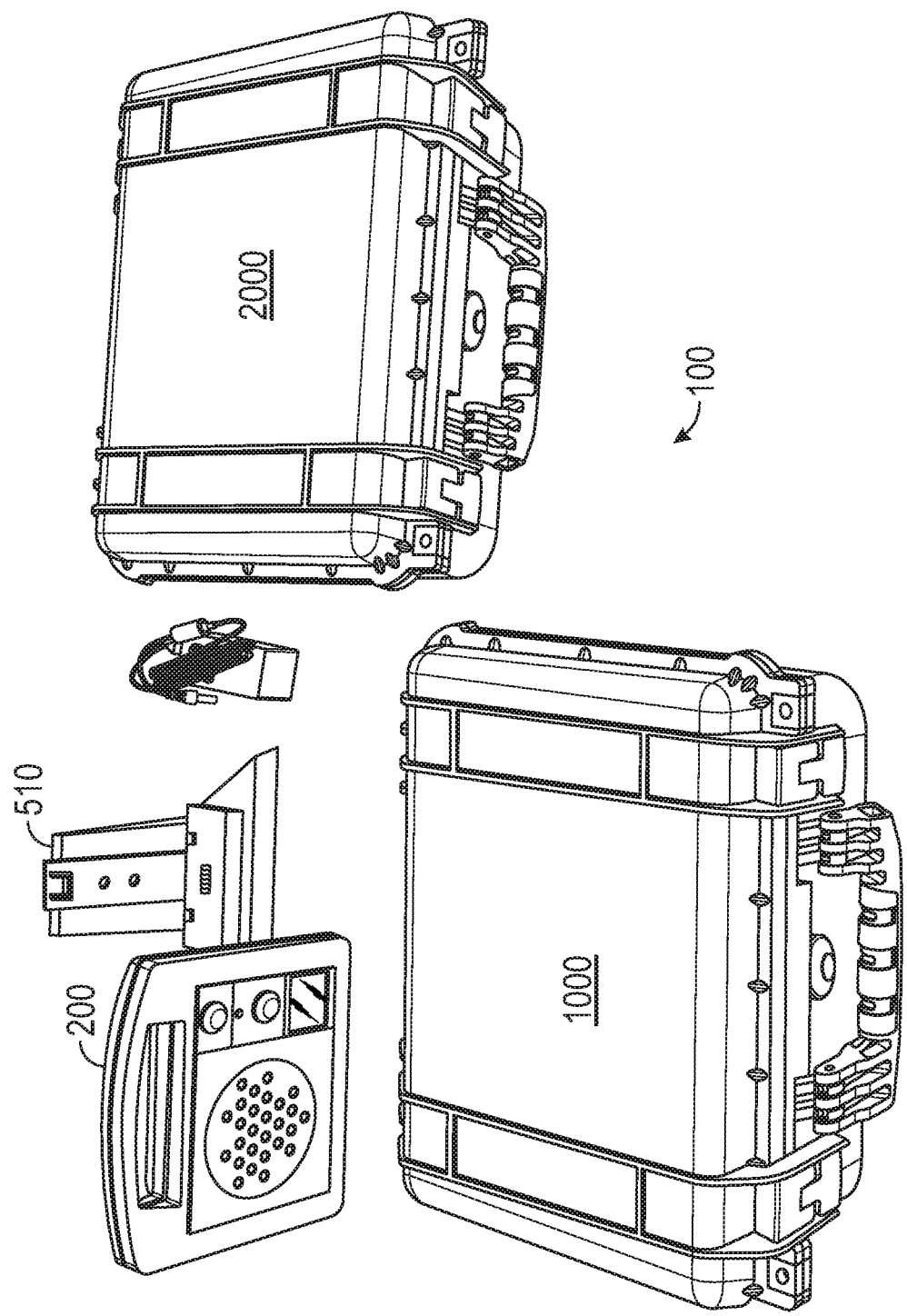
FIG. 1 is an illustration of an exemplary MU test system 100, according to a particular embodiment.

The present systems and apparatuses and methods are understood more readily by reference to the following detailed description, examples, drawings, and claims, and their previous and following description. However, before the present devices, systems, and/or methods are disclosed and described, it is to be understood that this invention is not limited to the specific devices, systems, and/or methods disclosed unless otherwise specified, as such can, of course, vary. It is also to be understood that the terminology used herein is for the purpose of describing particular aspects only and is not intended to be limiting.

Like parts are marked throughout the following description and drawings with the same reference numerals. The drawings may not be to-scale and certain features may be shown exaggerated in scale or in somewhat schematic format in the interest of clarity, conciseness, and to convey information.

The following description of the invention is provided as an enabling teaching of the invention in its best, currently known embodiment. To this end, those skilled in the relevant art will recognize and appreciate that many changes can be made to the various aspects of the invention described herein, while still obtaining the beneficial results of the present invention. It will also be apparent that some of the desired benefits of the present invention can be obtained by selecting some of the features of the present invention without utilizing other features. Accordingly, those who work in the art will recognize that many modifications and adaptations to the present invention are possible and can even be desirable in certain circumstances and are a part of the present invention. Thus, the following description is provided as illustrative of the principles of the present invention and not in limitation thereof.

As used throughout, the singular forms "a," "an" and "the" include plural referents unless the context clearly dictates otherwise. Thus, for example, reference to a component can include two or more such components unless the context indicates otherwise.

Ranges can be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

As used herein, the terms "optional" or "optionally" mean that the subsequently described event or circumstance may or may not occur, and that the description includes instances where said event or circumstance occurs and instances where it does not.

System

Although many of the systems and methods described herein are discussed in the context of a 27-conductor MU system 199 such as the ones used in North America, the technology disclosed herein is also useful and applicable in a variety of other contexts. For example, the devices and systems described herein would be useful and applicable for other types of MU systems that may be used in other countries and regions of the world. The devices and systems described herein would be useful and applicable for other onboard systems that may be used to coordinate and control other types of motive systems or vehicles.

FIG. 1 is an illustration of an exemplary MU test system 100 according to the disclosed embodiments. As shown, the MU test system 100 may include a first test unit 1000 (sometimes referred to as Box A), a second test unit 2000 (Box B), and a display unit 200. The display unit 200 may include a battery with a charging port and a charging stand 510.

Figure 2:
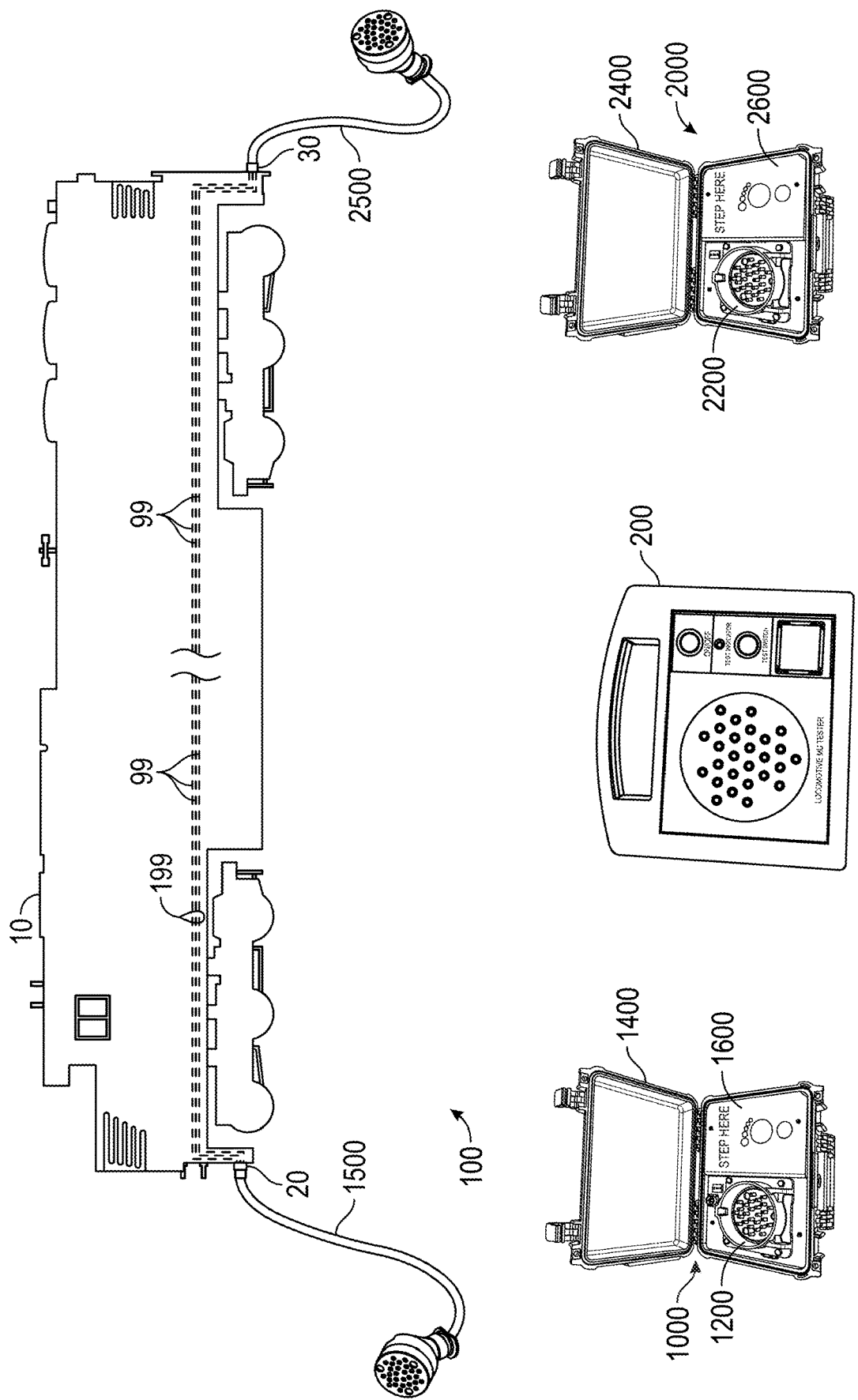
FIG. 2 is a schematic illustration of an exemplary MU test system 100, according to a particular embodiment.

FIG. 2 is a schematic illustration of an exemplary MU test system 100 configured for use with a locomotive 10, according to the disclosed embodiments. As shown, the locomotive 10 may have a front MU receptacle 20 and a rear MU receptacle 30. The MU test system 100 may include a first test unit 1000, a second test unit 2000, and a display unit 200. The first test unit 1000 may be connected by a first jumper cable 1500 to the front MU receptacle 20 (or, alternatively, to the rear MU receptacle 30). The second test unit 2000 may be connected by a second jumper cable 2500 to the other MU receptacle (20 or 30) the other end of the locomotive 10. As described herein, the display unit 200 may be connected to the test units 1000, 2000 wirelessly.

The first test unit 1000, as shown, may be housed in a durable, weatherproof case 1400. The first jumper cable 1500 may include a 27-pin connector on each end. As shown in FIG. 2, the first test unit 1000 may include on its face a 27-pin receptacle 1200 that is sized and shaped to mate with and receive the connector on the near or proximal end of the first cable 1500. The first unit 1000 may also include a foot rest 1600 upon which a technician may place a foot when disconnecting the first cable 1500 from the receptacle 1200. In general, MU jumper cables are relatively heavy and they often acquire a semi-permanent shape near the end connectors, sometimes making the disconnecting process more difficult compared to the effort to disconnect a smaller cable.

Similarly, the second test unit 2000 may be housed in a weatherproof case 2400 and may include on its face a 27-pin receptacle 2200 that is sized and shaped to mate with and receive the connector on the near or proximal end of the second cable 2500. The second unit 2000 may also include a foot rest 2600 upon which a technician may place a foot when disconnecting the second cable 2500 from the receptacle 2200.

Figure 3:
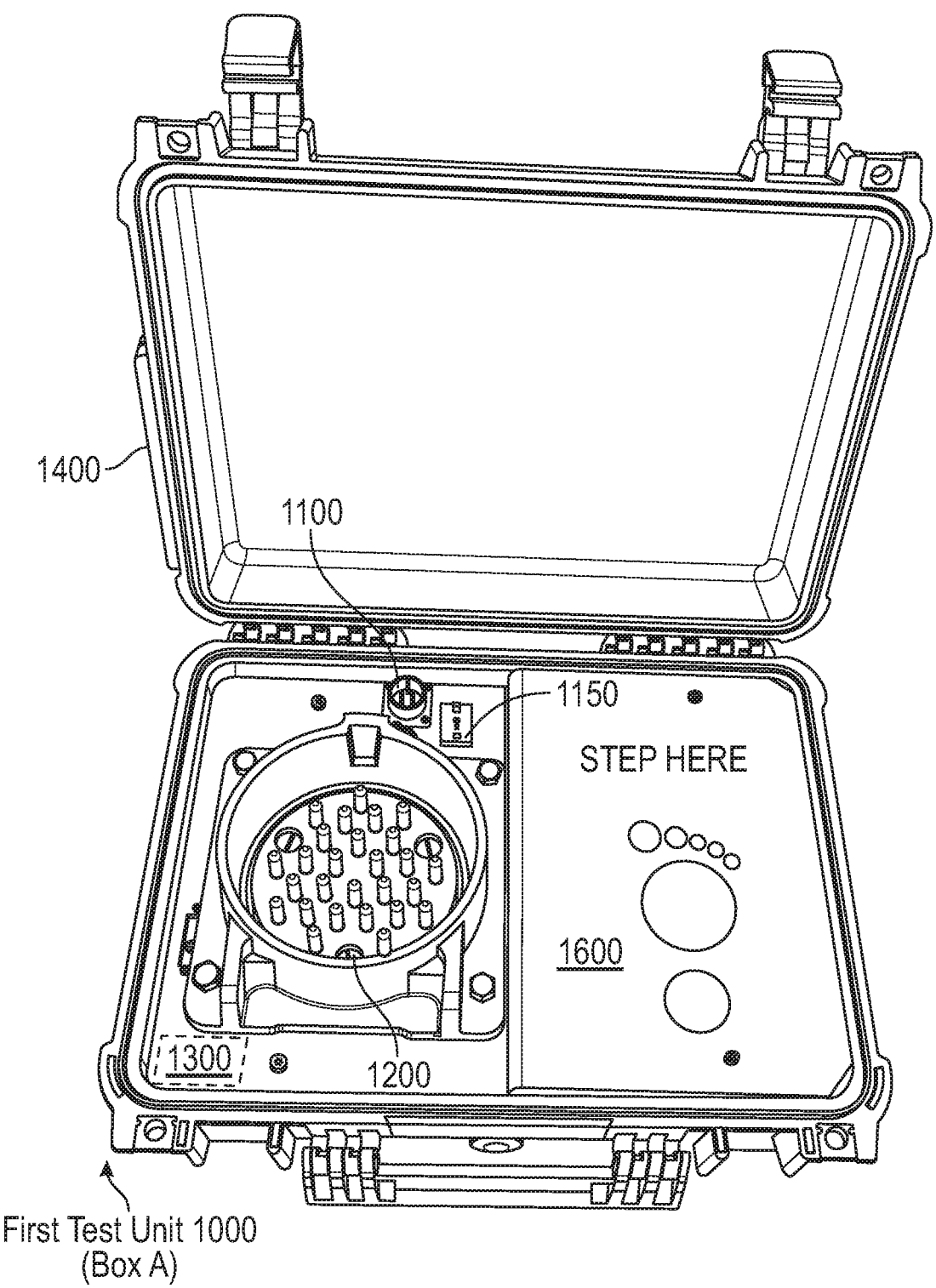
FIG. 3 is an illustration of an exemplary first test unit 1000, according to a particular embodiment.

FIG. 3 is an illustration of a first portable MU test unit 1000 inside its weatherproof case 1400, according to a particular embodiment. The test unit 1000 may include a power supply receptacle 1100 that is sized and shaped to connect with an external power supply, such as might be available in a train yard or shop for powering equipment. Power may be provided to the test units 1000, 2000 from an external power supply, via the receptacle 1100 on the first unit 1000, through the locomotive 10, and to the second unit 2000. Alternatively, power may be provided to the test units 1000, 2000 via one of the 27 conductors in the first or second MU jumper cable 1500, 2500. The standard set of 27 conductors 99 may include one devoted to power transmission and/or may include a spare conductor that can be configured to transmit power. The first MU test unit 1000 may also include a first transceiver 1300 for communicating wirelessly with the display unit 200. The first MU test unit 1000 may also include an on/off switch 1150.

Figure 4:
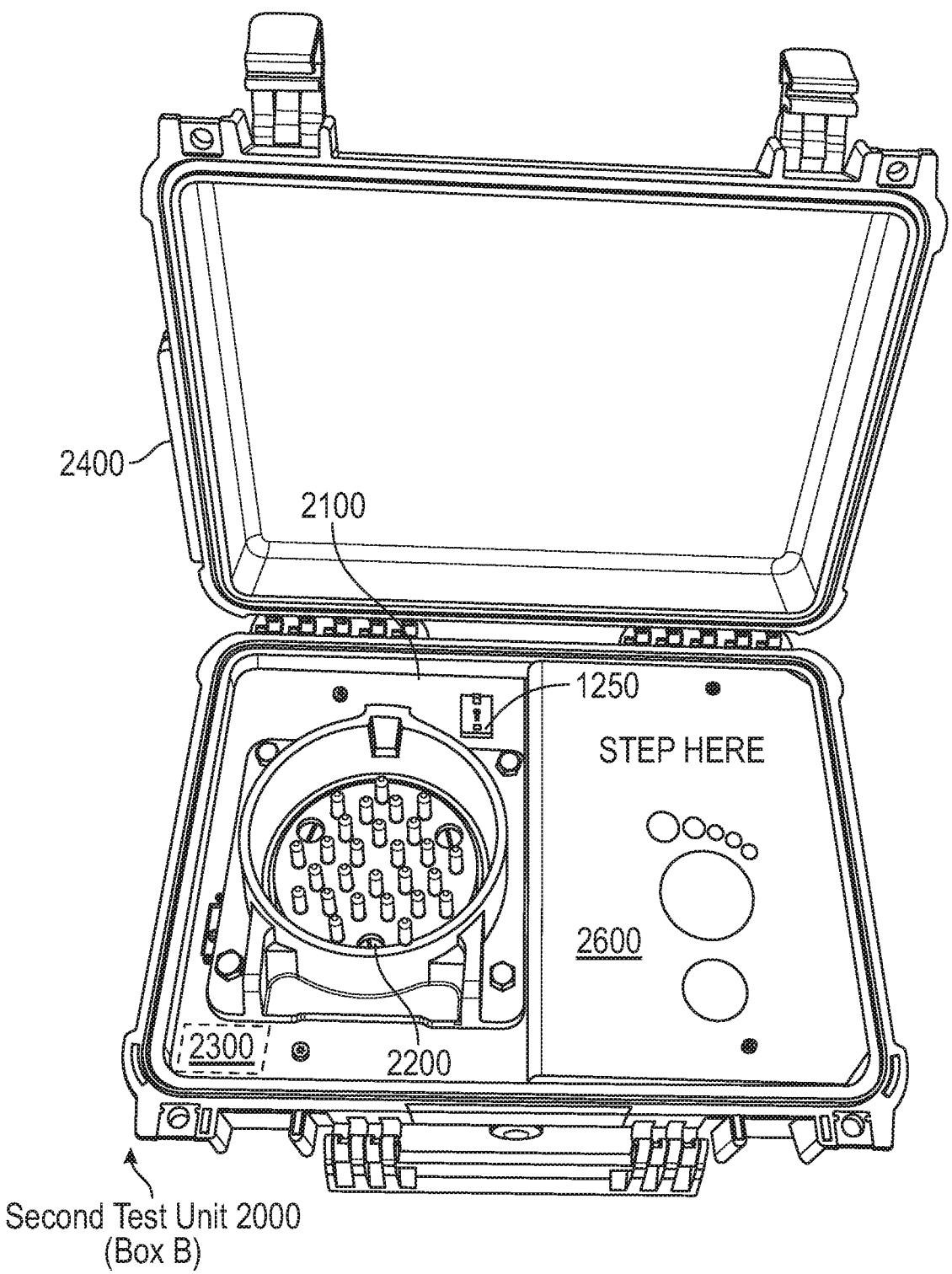
FIG. 4 is an illustration of an exemplary second test unit 2000, according to a particular embodiment.

FIG. 4 is an illustration of a second portable MU test unit 2000 inside its weatherproof case 2400, according to a particular embodiment. The test unit 2000 may not include a power supply receptacle for connecting with an external power supply. Instead, the second test unit 2000 may receive power as described above. The second MU test unit 2000 may also include a second transceiver 2300 for communicating wirelessly with the display unit 200. The second MU test unit 2000 may also include an on/off switch 2150.

The two portable MU test units 1000, 2000 may be paired specifically to the other, for use together in the field. Alternatively, each of the units 1000, 2000 may include a switch for selecting a channel, so that any first unit 1000 can be connected with any second unit 2000 in the field.

Figure 5:
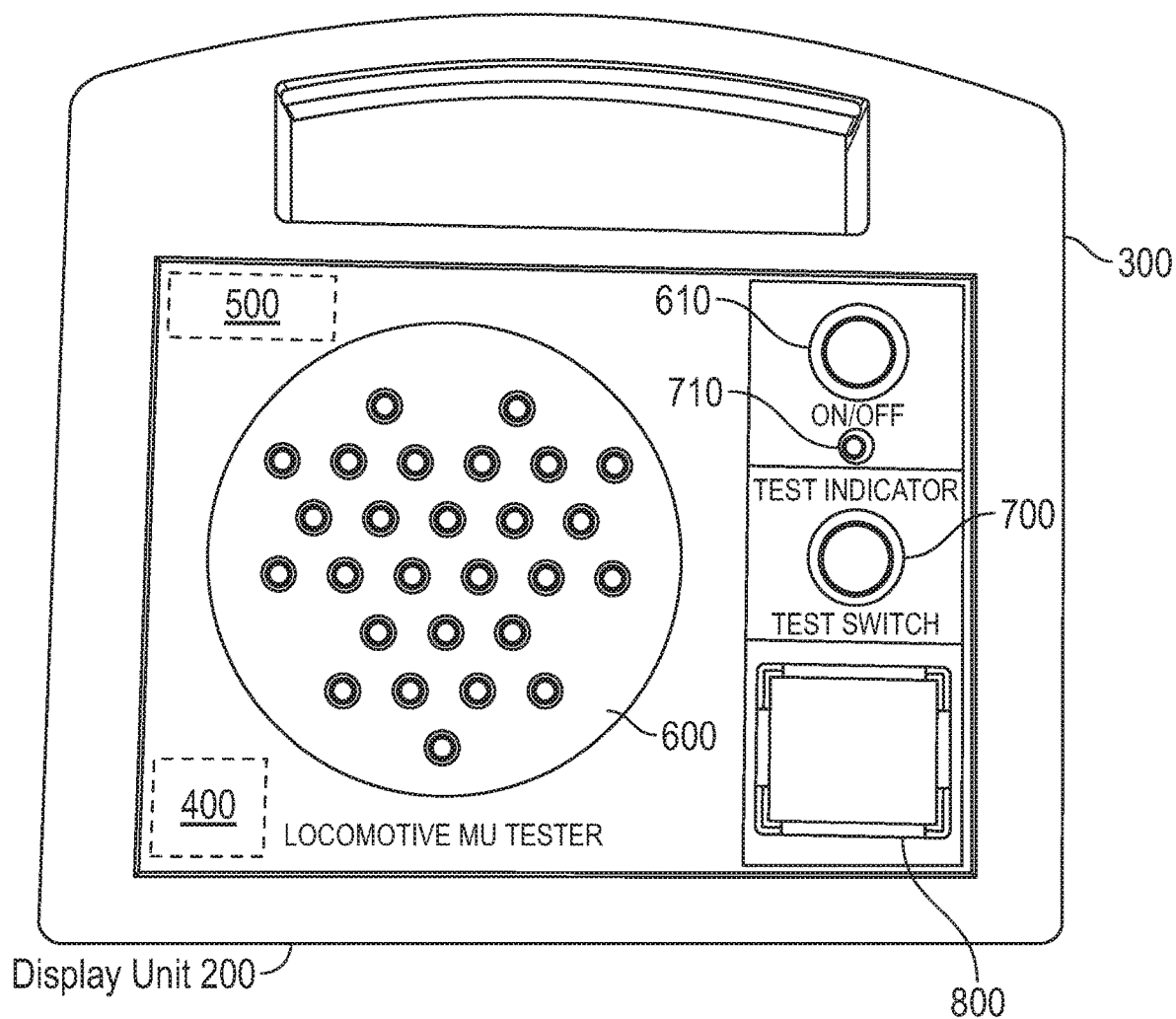
FIG. 5 is an illustration of an exemplary display unit 200, according to a particular embodiment.

FIG. 5 is an illustration of a portable display unit 200 in a housing 300 with a handle, according to a particular embodiment. The display unit 200 may include a battery 500 and a wireless transceiver 400 for communicating with the test units 1000, 2000. The battery 500 may be rechargeable and the display unit 200 may include a charging port and an AC-to-DC power adapter or other circuits to accommodate efficient charging. As shown in FIG. 1, the display unit 200 may include a charging port on the bottom of the housing 300 that is sized and shaped to connect with a connector on a charging stand 510. The charging stand 510 may include indicators to inform the user when the battery 500 in the display unit 200 is charging actively or fully charged.

The wireless transceiver 400 in the display unit 200 (as well as the transceivers 1300, 2300 in the first and second test units 1000, 2000 respectively) may be configured to operate using the ZigBee protocol for lower-power wireless communications. ZigBee is an IEEE 802.15.4-based specification for devices that are used in relatively small and lower-power networks. The transceivers 400, 1300, 2300 may include a ZigBee-enabled chip having an integrated radio, microcontroller, and memory. Alternatively, the wireless transceivers 400, 1300, 2300 may be configured to use any of a variety of other communications protocols, including but not limited to Bluetooth, Bluetooth Low-Energy (BLE or Bluetooth Smart), cellular, 802.11, 802.n, or other wireless local area network (wi-fi) systems known in the art or to be developed in the future.

As shown in FIG. 5, the front face of the display unit 200 may include an LED panel 600 that includes 27 indicators, each labeled with its corresponding conductor number printed on a face plate. Each indicator on the LED panel 600 may be two-color light emitting diode (LED), such as a red-or-green LED (green for OK conditions; red for NOT OK). The front face of the display unit 200 may also include a power button 610, a test switch 700 and test indicator 710, and a screen 800. The screen 800 may be configured to display the progress of a particular test protocol or procedure, the condition or status of certain parameters, or any of a variety of other messages to the user regarding the operation of the display unit 200, the remote test units 1000, 2000, and the MU test system 100 as a whole.

Use Case

The battery 500 in the display unit 200 may be charged by connecting the unit to a charging stand 510 such as the one shown in FIG. 1. When a component is modified or changed in some way on a locomotive 10, and when testing of the MU system 199 is therefore required or preferred, the system 100 as described herein may be connected to the locomotive 10.

In the field, as illustrated in FIG. 2, the weatherproof cases 1400, 2400 containing the portable MU test units 1000, 2000 may be located near the front and rear of the locomotive 10, respectively. One end of a first MU jumper cable 1500 may be connected to the front MU receptacle 20 and the other end to the MU receptacle 1200 on the first test unit 1000 in the field. Likewise, the second jumper cable 2500 may be connected between the rear MU receptacle 30 on the locomotive 120 and the MU receptacle 2200 on the second test unit 2000.

Power may be supplied to the units 1000, 2000 from an external power supply via a cable that is connected to a dedicated power receptacle 1100 on the first unit 100 or from the locomotive 10 via one of the 27 connectors in the MU jumper cable 1500. With a power source established, the two units 1000, 2000 may be switched on using the on/off switch 1150, 1250 respectively.

The display unit 200 may be placed within wireless range of the two test units 1000, 2000 and the power switch 610 may be used to turn on the unit 200. The display unit 200 may be configured to generate a number of displays on the screen 800. According to a particular embodiment, the display 800 includes five (5) basic screens, each having one or more overlays (including text or other indicia) for reporting the status or operation of the display unit 200.

Screen 1 may include a company name or logo, a product name such as "Locomotive MU Tester," and other basic information. The overlays for Screen 1 may include one or messages about the battery status, such as "Battery is Charged" or "Charge the Battery." The battery check may be part of a self-test performed by the display unit 200, during which it evaluates the condition and operational status of the display unit 200 itself in order to confirm that it is in good condition and ready to use. In this apsect, the overlays for Screen 1 may also include a "Self Test" and a "Diagnostic Check." Fault conditions displayed on the screen 800 may signal the technician or operator to repair or correct the fault before continuing.

Screen 2 may include information about the progress of a first step in the testing process; specifically, establishing a communications link between the display unit 200 and both of the remote MU test units 1000, 2000. The overlays for Screen 2 may include one or more messages about the process or status of establishing the communications link, such as "Establishing Communication . . ." or "Good Link" or "Comm Link Established." The overlays for Screen 2 may also include one or more messages instructing the user to proceed with one or more test protocols; for example, "Press TEST SWITCH to Begin MU Testing."

Screen 3 may be used to display information about communications errors or failures, such as "No Communication from "Forward MU Test Unit A" or "No Communication from Rear MU Test Unit B."

If no errors or failures occur, the system 100 may next display Screen 4, which displays information about the progress of the MU testing protocol. The overlays for Screen 4 may include one or more messages about each step in the testing, such as "Pass" or "Fail." The overlays may also include more specific messages, such as "Continuity Fail 12" indicating a lack of continuity between pin 12 on the first unit 1000 and pin 12 at the second unit 2000. Other overlays may include "Short 24-27" indicating there is a short or fault between conductor 24 and conductor 27. The technician or operator may use the information on the display screen 800 to repair or correct the particular fault.

LED Panel 600: In addition to the overlays for Screen 4 to be shown on the display screen 800, the continuity fails or shorts may be displayed on the LED panel 600. For example, when the overlay message reads "Continuity Fail 12" on the display 800, the LED next to number 12 on the LED Panel 600 may be red (indicating a failure) instead of green. Similarly, for example, when the overlay message reads "Short 24-27" on the display 800, the LEDs next to numbers 24 and 27 may both be red (indicating a failure) instead of both green. The technician or operator may use the information shown on the display screen 800 to repair or correct the particular fault.

Example Test Procedure: The display unit 200 may be configured to execute a standard or predetermined test procedure of the MU components. The test procedure may include one or more pre-set testing protocols and/or one or more customizable testing protocols that are accessible to the user. According to particular embodiments, the test procedure (after establishing and testing the communications link as described above) may include a continuity check and a shorts test. The continuity check may operate by testing the continuity between pin 1 on the first MU test unit 1000 and pin 1 on the second MU test unit 2000; and then between pin 2 and pin 2; and so forth, up to and including pin 27. Similarly, the shorts test may operate by testing, in order, whether a fault condition or short exists (in which two or more of the 27 conductors 99 are shorted together) or to detect a leakage (in which one of the conductors 99 is shorted to the chassis).

The overlays for Screen 4 may include one or more messages instructing the user to proceed with one or more test protocols, such as "Press TEST SWITCH again to Begin Monitor Mode."

In monitor mode, the display unit 200 and remote units 1000, 2000 may be configured to continuously monitor the status of the MU components while one or more operators or technicians makes changes to the specific settings (for example, the throttle position) and other systems onboard the locomotive 10 that are specifically related to certain of the 27 conductors 99 in the MU system 199. In this aspect, the monitor Screen 5 may display information about the status of the systems being adjusted on the locomotive 10. The overlays for Screen 5"Monitoring" may include, for example, "Throttle . . . ," "Dynamic . . . ," "Reverser . . . ," "Headlight . . . ," and "Sand." In this aspect, Screen 5 may include information about each component being tested. In this example, the monitoring system is active for testing of the Throttle positions, Dynamic throttle positions, Reverser positions, Headlight states (on/off), and Sand states (on/off).

The overlays for Screen 5 may include one or more messages about the state or condition of each component being tested. For example:

For each Throttle position, the following overlays may be displayed:
IDLE
NOTCH 1
NOTCH 2
NOTCH 3
NOTCH 4
NOTCH 5
NOTCH 6
NOTCH 7
NOTCH 8
Dynamic Setup
Dynamic Brake For each Dynamic throttle position, the following overlays may be displayed:
NOTCH 1
NOTCH 2
NOTCH 3
NOTCH 4
NOTCH 5
NOTCH 6
NOTCH 7
NOTCH 8

For each Reverser position, the following overlays may be displayed:
CENTERED
FORWARD
REVERSE For each Headlight state, the following overlays may be displayed:
ON
OFF For each Sand state, the following overlays may be displayed:
ON
OFF The monitoring system and its related display screen (and overlays) may be adjusted to sense, analyze, report, and display the operational status or condition of any of a variety of onboard systems.

Although several embodiments have been described herein, those of ordinary skill in art, with the benefit of the teachings of this disclosure, will understand and comprehend many other embodiments and modifications for this technology. The invention therefore is not limited to the specific embodiments disclosed or discussed herein, and that may other embodiments and modifications are intended to be included within the scope of the appended claims. Moreover, although specific terms are occasionally used herein, as well as in the claims that follow, such terms are used in a generic and descriptive sense only, and should not be construed as limiting the described invention or the claims that follow.

The invention claimed is:

1. A system for testing one or more conductors of a multiple-unit train control system onboard a locomotive, wherein said system extends from a front receptacle to a rear receptacle, comprising:
    a first test unit selectively connected to said front receptacle by a first jumper cable and comprising a first transceiver;
    a second test unit selectively connected to said rear receptacle by a second jumper cable and comprising a second transceiver; and
    a portable display unit comprising a test switch, a screen, a wireless transceiver in communication with said first transceiver and said second transceiver, and a panel of indicators each corresponding to one of said one or more conductors onboard said locomotive,
    wherein said portable display unit is configured to execute a test procedure for evaluating a status of said one or more conductors when both said first test unit and said second test unit are connected, to receive said status wirelessly via said wireless transceiver, and to display information about said status on both said screen and said panel of indicators.

2. The system of claim 1, wherein said portable display unit is further configured to execute a monitoring procedure for monitoring a condition of one or more onboard components, each of which is connected to one of said one or more conductors, and to display information about said condition on said screen or on said panel of indicators.

3. The system of claim 1, wherein said one or more conductors of said multiple-unit train control system consists of twenty-seven multiple-unit conductors compliant with applicable standards for operation of multiple-unit locomotives in North America, and wherein said panel of indicators comprises a panel of twenty-seven LED lamps each corresponding to one of said twenty-seven multiple-unit conductors and each configured to display at least two colors.

4. The system of claim 1, wherein said portable display unit further comprises a rechargeable battery connected to an external charging port that is sized and shaped to engage with a charging plug on a charging stand.

5. The system of claim 1, wherein said first test unit comprises a first cable receptacle sized and shaped to mate with and receive a connector on a proximal end of said first jumper cable, and wherein said second test unit comprises a second cable receptacle sized and shaped to mate with and receive a connector on a proximal end of said second jumper cable.

6. The system of claim 5, wherein said first test unit comprises a first footrest sized and shaped to support at least a portion of a foot to facilitate removal of said first jumper cable from said first MU cable receptacle, and wherein said second test unit comprises a second footrest sized and shaped to support at least a portion of a foot to facilitate removal of said second jumper cable from said second MU cable receptacle.

7. The system of claim 1, wherein said first test unit further comprises a power supply receptacle that is sized and shaped to mate with and receive a power cable from an external power supply, and wherein said system is configured to transmit power via said power supply receptacle on said first test unit to both said first test unit and said second test unit.

8. The system of claim 1, wherein each of said first transceiver, said second transceiver, and said wireless transceiver is configured to operate using the ZigBee protocol.

9. A system for testing one or more conductors of a multiple-unit train control system onboard a locomotive, wherein said system extends from a front receptacle to a rear receptacle, comprising:

a first test unit selectively connected to said front receptacle by a first jumper cable, said first test unit comprising a first transceiver, a first cable receptacle sized and shaped to mate with and receive a connector on a proximal end of said first jumper cable, and a first footrest sized and shaped to support at least a portion of a foot to facilitate removal of said first jumper cable from said first cable receptacle;

a second test unit selectively connected to said rear receptacle by a second jumper cable, said second test unit comprising a second transceiver, a second cable receptacle sized and shaped to mate with and receive a connector on a proximal end of said second jumper cable, and a second footrest sized and shaped to support at least a portion of a foot to facilitate removal of said second jumper cable from said second cable receptacle; and a portable display unit comprising a test switch, a screen, a wireless transceiver in communication with said first transceiver and said second transceiver, and a panel of indicators each corresponding to one of said one or more conductors onboard said locomotive, wherein said portable display unit is configured to execute a test procedure for evaluating a status of said one or more conductors and to display information about said status on both said screen and said panel of indicators.

* * * * *